(12) United States Patent
Ke

(10) Patent No.: US 10,474,573 B2
(45) Date of Patent: Nov. 12, 2019

(54) METHOD FOR MANAGING FLASH MEMORY MODULE AND ASSOCIATED FLASH MEMORY CONTROLLER AND ELECTRONIC DEVICE

(71) Applicant: Silicon Motion Inc., Hsinchu County (TW)

(72) Inventor: Kuan-Yu Ke, Hsinchu County (TW)

(73) Assignee: Silicon Motion Inc., Hsinchu County (TW)

( * ) Notice: Subject to any disclaimer, the term of this patent is extended or adjusted under 35 U.S.C. 154(b) by 13 days.

(21) Appl. No.: 16/006,854

(22) Filed: Jun. 13, 2018

(65) Prior Publication Data

US 2019/0227926 A1  Jul. 25, 2019

(30) Foreign Application Priority Data

Jan. 19, 2018 (TW) .............................. 107101932 A

(51) Int. Cl.
*G06F 12/00* (2006.01)
*G06F 12/02* (2006.01)
*G06F 3/06* (2006.01)

(52) U.S. Cl.
CPC ........ *G06F 12/0253* (2013.01); *G06F 3/0604* (2013.01); *G06F 3/064* (2013.01); *G06F 3/0679* (2013.01)

(58) Field of Classification Search
None
See application file for complete search history.

(56) References Cited

U.S. PATENT DOCUMENTS

| | | | |
|---|---|---|---|
| 8,407,449 B1* | 3/2013 | Colon ................. | G06F 12/0246 711/103 |
| 9,298,578 B2 | 3/2016 | Kang | |
| 9,652,330 B2* | 5/2017 | Yeh ..................... | G06F 11/1441 |
| 2014/0115233 A1* | 4/2014 | Goss ................... | G06F 12/0246 711/103 |
| 2015/0332770 A1* | 11/2015 | Kim .................... | G11C 16/0483 365/185.12 |
| 2015/0347295 A1 | 12/2015 | Ihm | |
| 2016/0110114 A1* | 4/2016 | Moon .................. | G06F 12/0246 711/103 |
| 2016/0267004 A1 | 9/2016 | Perlstein | |
| 2017/0177235 A1* | 6/2017 | Nishikubo ........... | G06F 3/0659 |
| 2017/0255550 A1 | 9/2017 | Kim | |
| 2017/0286289 A1 | 10/2017 | Chu | |
| 2018/0004653 A1 | 1/2018 | Moon | |
| 2018/0307496 A1* | 10/2018 | Ke ...................... | G06F 11/2268 |
| 2019/0220392 A1* | 7/2019 | Lin ..................... | G06F 12/0246 |

FOREIGN PATENT DOCUMENTS

TW            201324154 A1    6/2013

* cited by examiner

*Primary Examiner* — John A Lane
(74) *Attorney, Agent, or Firm* — Winston Hsu

(57) ABSTRACT

A method for managing a flash memory module, an associated flash memory controller and an associated electronic device are provided, wherein the method includes: when the flash memory module is powered on, and a garbage collection operation is not finished before the flash memory module is powered on: determining a progress of the garbage collection operation to generate a determination result; and determining to discard a target block in the garbage collection operation or to write dummy data into remaining pages of the target block according to the determination result.

20 Claims, 3 Drawing Sheets

METHOD FOR MANAGING FLASH MEMORY MODULE AND ASSOCIATED FLASH MEMORY CONTROLLER AND ELECTRONIC DEVICE

BACKGROUND OF THE INVENTION

1. Field of the Invention

The present invention relates to flash memory, more particularly, to a method for managing flash memory module and an associated flash memory controller and an electronic device.

2. Description of the Prior Art

In access to some flash memory modules, a flash memory controller may write data from a host device to a Single-Level Cell (SLC) block of the flash memory module, and then perform a garbage collection operation to move valid data in the SLC block to a Triple-Level Cell (TLC) block. Ina situation where power off recovery (POR) or sudden power off recovery (SPOR) happen during garbage collection, when the flash memory module is powered on again, it is typical to discard the previously utilized TLC block, for preventing errors of the data in the TLC clock due to power off conditions, and to restart the garbage collection operation. However, the method above may degrade the performance of the flash memory controller. More particularly, when the flash memory module is a 3D NAND-type flash module, as each block has many data pages, discarding the previously utilized TLC block directly may seriously impact the performance more.

SUMMARY OF THE INVENTION

One of the objectives of the present invention is to provide a method for managing a flash memory module, such as that capable of determining how to deal with the previously utilized TLC block according to a progress of the garbage operation, in order to solve the related art problems.

In an embodiment of the present invention, a method for managing a flash memory module is provided, where the method comprises the following steps: when the flash memory module is powered on, and a garbage collection operation is not finished before the flash memory module is powered on: determining a progress of the garbage collection operation to generate a determination result; and determining to discard a target block in the garbage collection operation or to write dummy data into remaining pages of the target block according to the determination result.

In another embodiment of the present invention, a flash memory controller is provided, wherein the flash memory controller is utilized for accessing a flash memory module, and the flash memory controller comprises a read only memory and a microprocessor, wherein the read only memory is arranged for storing a program code, and the microprocessor is arranged for executing the program code to control access to the flash memory module. In operations of the flash memory controller, when the flash memory controller and the flash memory module are powered on, and a garbage collection operation is not finished before the flash memory module is powered on, the microprocessor determines a progress of the garbage collection operation to generate a determination result, and determines to discard a target block in the garbage collection operation or to write dummy data into remaining pages of the target block according to the determination result.

In another embodiment of the present invention, an electronic device is provided, where the electronic device comprises a flash memory module and a flash memory controller. When the flash memory module is powered on, and a garbage collection operation is not finished before the flash memory module is powered on, the flash memory controller determines a progress of the garbage collection operation to generate a determination result, and determines to discard a target block in the garbage collection operation or to write dummy data into remaining pages of the target block according to the determination result.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
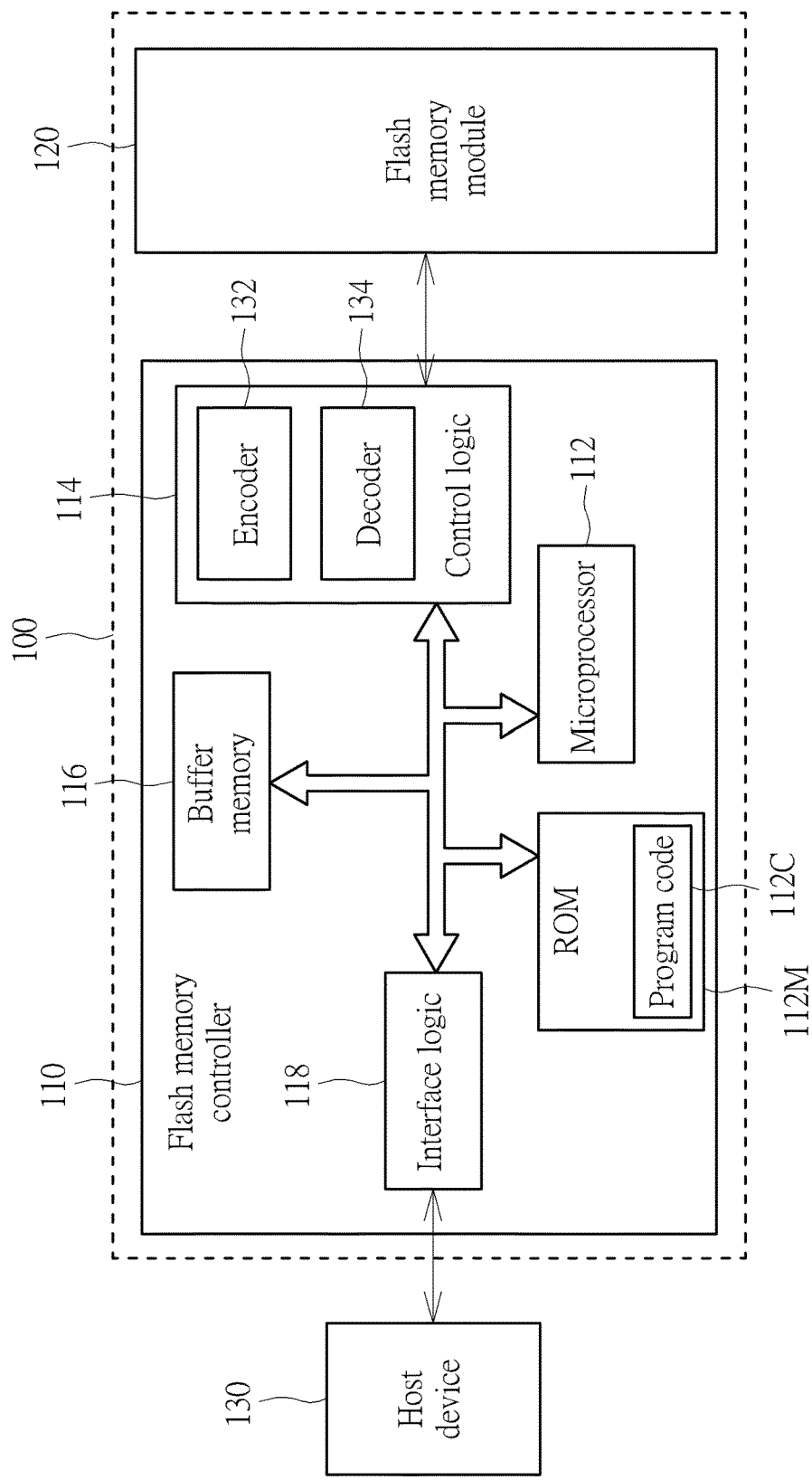
FIG. 1 is a diagram illustrating a memory device according to an embodiment of the present invention.

FIG. 1 is a diagram illustrating a memory device 100 according to an embodiment of the present invention. The memory device 100 comprises a flash memory module 120 and a flash memory controller 110, and the flash memory controller 110 is arranged for accessing the flash memory 120. According to this embodiment, the flash memory controller 110 comprises a microprocessor 112, a read only memory (ROM) 112M, a control logic 114, a buffer memory 116, and an interface logic 118. The ROM 112M is arranged for storing a program code 112C, and the microprocessor 112 is arranged for executing the program code 112C to control access to the flash memory module 120. The control logic 114 comprises an encoder 132 and a decoder 134, where the encoder 132 is arranged for encoding data written into the flash memory module 120 to generate corresponding check code (or called, error correction code (ECC)), and the decoder 134 is arranged for decoding data read out from the flash memory module 120.

Typically, the flash memory module 120 comprises multiple flash memory chips, and each of the flash memory chips comprises a plurality of blocks, and the flash memory controller 110 may perform data erasing operations on the flash memory module 120 in unit of block. In addition, a block may record a specific number of pages, where the flash memory controller 110 may perform data writing operations on the flash memory module 120 in unit of page. In this embodiment, the flash memory module 120 is a 3D NAND-type flash module.

In practice, the flash memory controller 110 executing the program code 112C through the microprocessor 112 may utilize internal components within the flash memory controller 110 to perform various control operations, for example: utilizing the control logic 114 to control access operations of the flash memory module 120 (more particularly, the access operation to at least one block or at least one page), utilizing the buffer memory 116 to perform required buffer processing, and utilizing the interface logic 118 to communicate with a host device 130. The buffer memory 116 is implemented by a random access memory (RAM). For example, the buffer memory 116 may be a static RAM (RAM), but the present invention is not limited thereto.

In an embodiment, the memory device 100 may be a portable memory device (e.g. a memory card conforming to SD/MMC, CF, MS or XD specifications), and the host device 130 is an electronic device that is capable of connecting with memory devices, such as a mobile phone, a laptop computer and a desktop computer, etc. And in another embodiment, the memory device 100 may be a solid state drive or an embedded storage device conforming to universal flash storage (UFS) or embedded multi media card (EMMC) specifications, to be arranged in an electronic device, such as a mobile phone, a laptop computer, or a desktop computer, where the host device 130 may be a processor of the electronic device.

Figure 2:
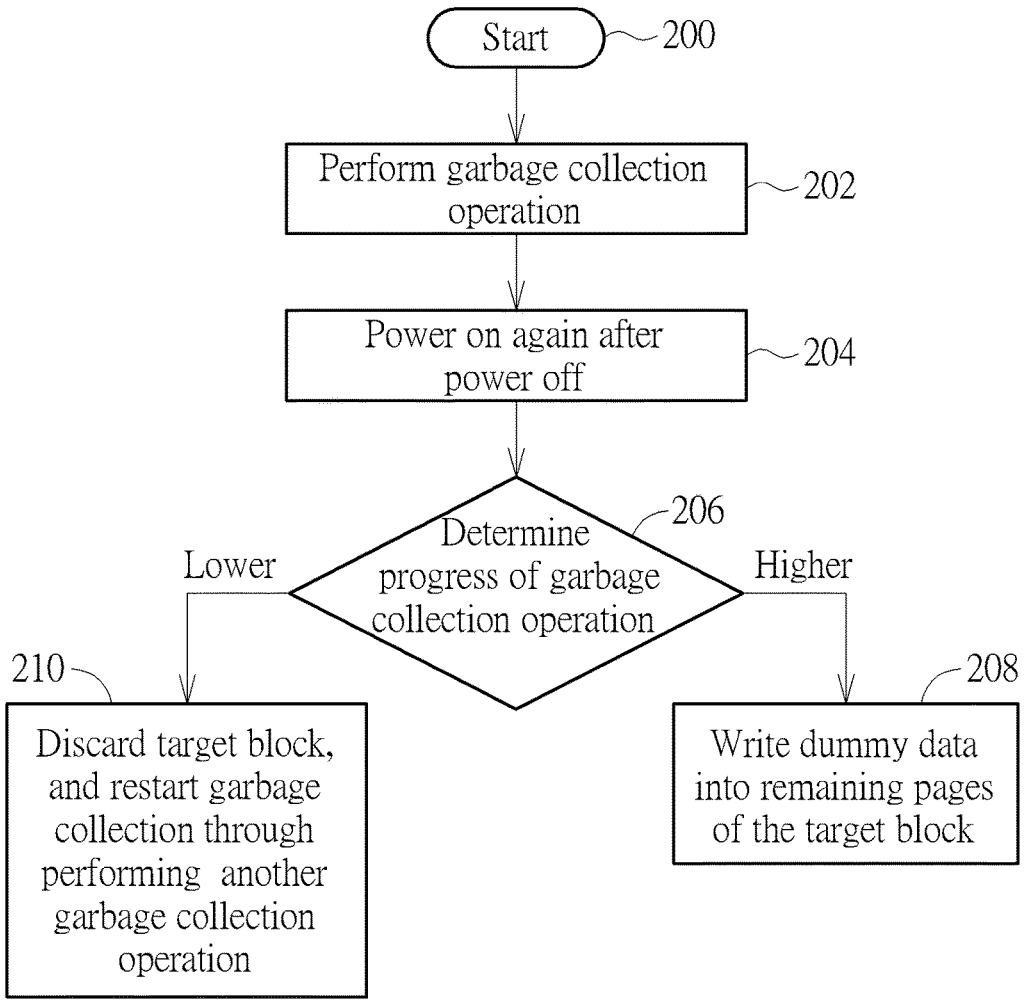
FIG. 2 is a flowchart illustrating managing the flash memory module according to an embodiment of the present invention.
Figure 3:
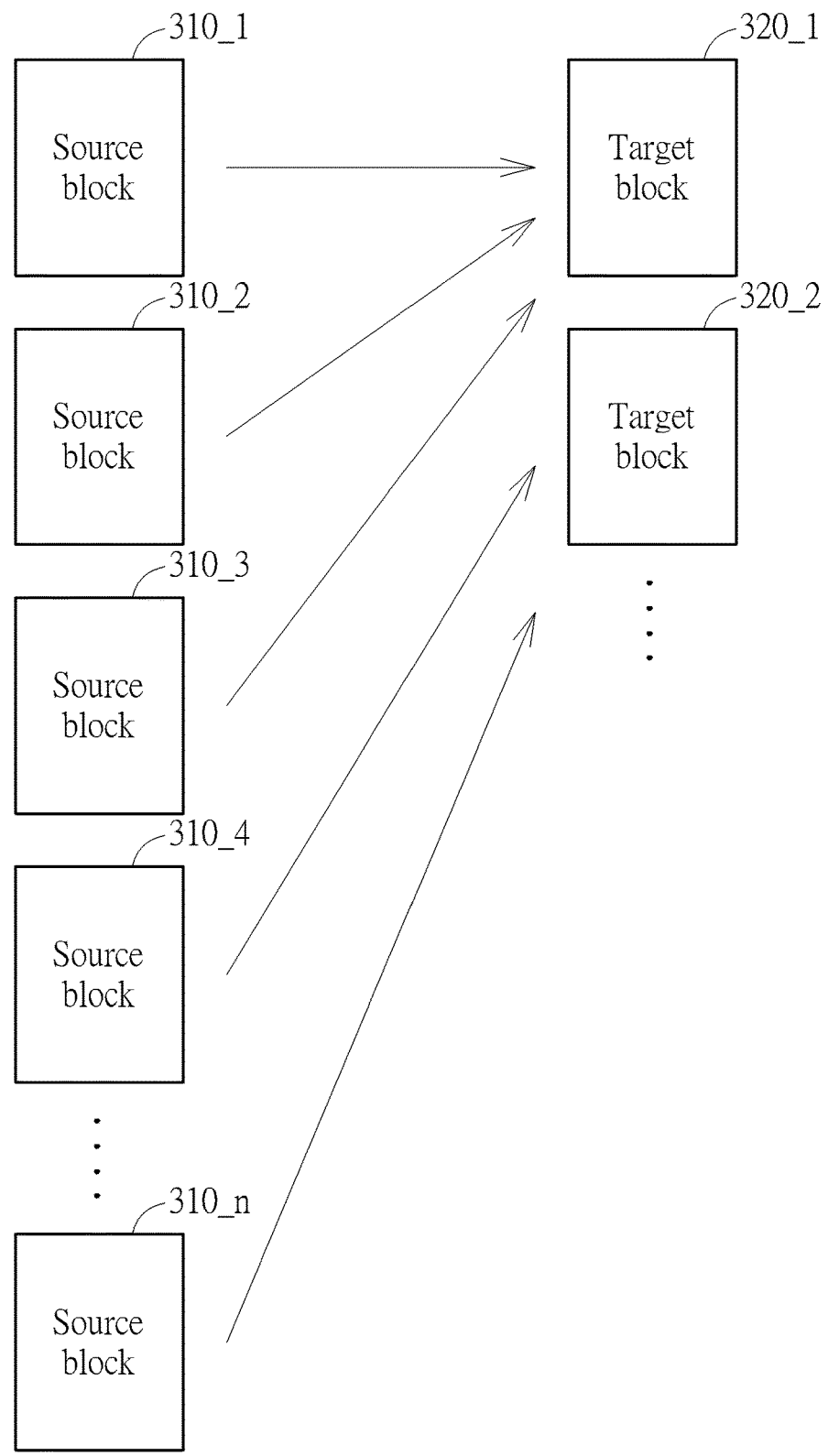
FIG. 3 is a diagram illustrating moving valid data of multiple source blocks to multiple target blocks during garbage collection.

Refer to FIG. 2, which is a flowchart of managing the flash memory module 120 according to an embodiment of the present invention. In Step 200, the flow begins. In Step 202, the flash memory controller 110 performs garbage collection operation(s) on the flash memory module 120 to release blocks for further usage. Specifically, referring to FIG. 3, assume that the flash memory module 120 comprises multiple source blocks 310_1-310_n and multiple target blocks 320_1 and 320_2, where the multiple source blocks 310_1-310_n may be SLC blocks, and the multiple target blocks 320_1 and 320_2 may be TLC blocks. In the operations of the memory device 100, when the flash memory controller 110 receives writing commands from the host device 130, the flash memory controller 110 may write data into the source blocks 310_1-310_n sequentially. A portion of the written data may become invalid data due to follow-up data update. As a result, when the number of remaining blocks in the source blocks 310_1-310_n that may be utilized for writing is not enough, the flash memory controller 110 moves valid data in the source blocks 310_1-310_n to the target blocks 320_1 and 320_2 in order to release the source blocks 310_1-310_n for further usage. The above-mentioned operation is called garbage collection operation. However, triggering conditions of the garbage collection operation are not limited to the above-mentioned condition that the number of the remaining blocks in the source blocks 310_1-310_n that may be utilized for writing is not enough. For example, the triggering condition may be that data quality of some of the source blocks 310_1-310_n is not good, or that considering wear-leveling technologies. As those skilled in the art should be able to understand the operation contents of the garbage collection operation, associated contents do not go into details here.

In Step 204, power off recovery (POR) or sudden power off recovery (SPOR) happens in the procedure of the flash memory controller 110 moving the valid data in the source blocks 310_1-310_n to the target blocks 320_1 and 320_2, which means the garbage collection operation is terminated, suddenly, due to power off in a situation where the garbage collection is not finished, and then the memory device 100 is powered on again.

In Step 206, after the memory device 100 is powered on again, the flash memory controller 110 first determines whether the memory device 100 encountered an abnormal power off condition before. Specifically, when the memory device 100 is shut down/powered off in a normal condition, the flash memory controller 110 may store multiple temporary tables and data that are stored in the buffer memory 116 into the flash memory module 120, and the information stored into the flash memory module 120 comprises a flag for indicating whether the memory device is shut down normally. Therefore, the flash memory controller 110 may determine whether the memory device has encountered the abnormal power off condition previously through reading the above-mentioned flag stored in the flash memory module 120 after the flash memory controller is powered on. For example, when the above-mentioned flag is not set up correctly, the flash memory controller 110 may determine that the memory device 100 has encountered the abnormal power off previously. In this embodiment, the memory device 100 does encounter the abnormal power off.

Then, when the flash memory controller 110 determines that the abnormal power off condition exists and the garbage collection operation is not finished, the flash memory controller 110 may determine a progress of the previously performed garbage collection operation (e.g. the progress of the garbage collection operation that is not finished) to generate a determination result, wherein: when the determination result indicates that the progress of the previously performed garbage collection operation is higher, the flow proceeds to Step 208; and when the determination result indicates that the progress of the previously performed garbage collection operation is lower, the flow proceeds to Step 210. Specifically, assume that the flash memory controller 110 is moving the valid data in the source blocks 310_1-310_n to the target block 320_1 sequentially before the power off, and the flash memory controller 110 may generate the determination result according to an amount of data written into the target block 320_1, and/or a number of the source blocks within the multiple source blocks 310_1-310_n that have finished valid data moving.

In a first example, the flash memory controller 110 reads the target block 320_1 to determine the amount of the data written into the target block 320_1, where the amount of the data is the amount of the valid data moved from the source blocks 310_1-310_n to the target block 320_1. Afterward, the flash memory controller 110 determines whether the amount of the data is less than a first threshold value. If the amount of the data within the source block 320_1 is less than the first threshold value, the flow proceeds to Step 210; otherwise, the flow proceeds to Step 208. In this embodiment, the first threshold value may be any parameter that is capable of being utilized for determining the amount of the data within the target block 320_1, for example, the number of pages that have been written with data within the target block 320_1, or the proportion of storage space that has been written with data in the target block 320_1 (e.g. 60% or 70%).

In a second example, the flash memory controller 110 determines the number of source blocks within the source blocks 310_1-310_n that have finished valid data moving. When the number of the source blocks that have finished the valid data moving is less than a second threshold value, the flow proceeds to Step 210; otherwise, the flow proceeds to Step 208. In this embodiment, the second threshold value may be 2, 3, 4 or any number that is suitable. Taking the case that the second threshold value is "3" as an example, if the flash memory controller 110 determines that only the source blocks 310_1 and 310_2 have finished all of their valid data moving, as the number of the source blocks that has finished their valid data moving (e.g. 2) is less than the second threshold value "3", the flash memory controller 110 determines that the progress of the previously performed garbage collection operation is lower; on the other hand, if the flash memory controller 110 determines that all of the source blocks 310_1-310_4 have finished their valid data moving, as the number of the source blocks that has finished their valid data moving (e.g. 4) is not less than the second threshold value "3", the flash memory controller 110 determines that the progress of the previously performed garbage collection operation is higher.

In a third example, the flash memory controller 110 may generate the determination result according to the amount of the data written into the target block 320_1, and/or the number of source blocks within the multiple source blocks 310_1-310_n that have finished the valid data moving (e.g., according to both of them). Specifically, when the determination result indicates that the amount of the data written into the target block 320_1 is less than the first threshold value, or the number of the source blocks that have finished the valid data moving is less than the second threshold value, the flash memory controller 110 determines that the progress of the previously performed garbage collection operation is lower; and when the determination result indicates that the amount of the data written into the target block 320_1 is not less than the first threshold value, and the number of the source blocks that have finished the valid data moving is not less than the second threshold value, the flash memory controller 110 determines that the progress of the previously performed garbage collection operation is higher. Taking the case that the first threshold value is "70%" and the second threshold value is "3" as an example, only when the amount of the data written into the target block 320_1 is not less than 70%, and the number of the source blocks that have finished the valid data moving is not less than "3", the flash memory controller 110 determines the progress of the previously performed garbage collection operation is higher and make the flow proceed to Step 208.

In Step 208, as the determination result indicates that the progress of the previously performed garbage collection operation is higher, which means the target block 320_1 has already stored a certain amount (e.g. a huge amount) of valid data, consequently, the target block 320_1 may be preserved for conserving the huge amount of the valid data that has already been written therein. In addition, considering stability of the target block 320_1, it is suggested that the flash memory controller 110 may write dummy data into all of remaining pages of the target block 320_1. On the other hand, as the data of the target block 320_1 has been conserved, the data of the source blocks that have finished the valid data moving (e.g. moving to the target block 320_1), such as the four source blocks 310_1-310_4, may be erased to release the storage space.

In Step 210, as the determination result indicates that the progress of the previously performed garbage collection operation is lower, which means the amount of the data stored in the target block 320_1 may be not enough, consequently, the flash memory controller 110 discards the target block 320_1 directly, and performs another garbage collection operation to move the valid data of the multiple source blocks 310_1-310_n to another target block. For example, the target block 320_1 may be marked as invalid, and the flash memory controller 110 may wait until the flash memory controller 110 is idle, to erase the data of the target block 320_1; in addition, the flash memory controller 110 performs the aforementioned another garbage collection operation to move the valid data of the source block 310_1-310_n to the target block 320_2.

In above-mentioned embodiments, when the progress of the garbage collection operation performed before the power off is lower, as the valid data stored in the target block 310_1 is not much, writing the dummy data into all of the remaining pages within the target block 310_1 may take lots of time, and therefore, the flash memory controller 110 directly discards the target block 310_1 entirely and restarts garbage collection through performing the aforementioned another garbage collection operation to improve performance of the memory device 100. On the other hand, when the progress of the garbage collection operation performed before the power off is higher, as the target block 310_1 has stored more valid data, the flash memory controller 110 writes the dummy data into all of the remaining pages within the target block 310_1 to conserve the huge amount of the data that has previously stored in the target block 310_1.

As mentioned above, through determining the progress of the garbage collection operation performed before the power off to determine how to deal with the target block(s), the present invention method and apparatus can effectively manage the blocks and improve the performance of the memory.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for managing a flash memory module, comprising:
   when the flash memory module is powered on, and a garbage collection operation is not finished before the flash memory module is powered on:
   determining a progress of the garbage collection operation to generate a determination result; and
   determining to discard a target block in the garbage collection operation or to write dummy data into remaining pages of the target block according to the determination result.

2. The method of claim 1, wherein the garbage collection operation is moving valid data of multiple source blocks to the target block, and the step of determining to discard the target block in the garbage collection operation or to write the dummy data into the remaining pages of the target block according to the determination result comprises:
   when the determination result indicates that the progress of the garbage collection operation is lower, discarding the target block, and performing another garbage collection operation to move the valid data of the multiple source blocks to another target block;
   when the determination result indicates that the progress of the garbage collection operation is higher, writing the dummy data into the remaining pages of the target block.

3. The method of claim 1, wherein the garbage collection operation is moving valid data of multiple source blocks to the target block, and the step of determining the progress of the garbage collection operation to generate the determination result comprises:
   generating the determination result according to an amount of data written into the target block.

4. The method of claim 3, wherein the step of determining to discard the target block in the garbage collection operation or to write the dummy data into the remaining pages of the target block according to the determination result comprises:
   when the determination result indicates that the amount of the data written into the target block is less than a threshold value, discarding the target block, and performing another garbage collection operation to move the valid data of the multiple source blocks to another target block; and when the determination result indicates that the amount of the data written into the target block is not less than the threshold value, writing the dummy data into the remaining pages of the target block.

5. The method of claim 3, wherein the step of determining the progress of the garbage collection operation to generate the determination result comprises:

generating the determination result according to the amount of the data written into the target block and a number of source blocks within the multiple source blocks that have finished valid data moving.

6. The method of claim 5, wherein the step of determining to discard the target block in the garbage collection operation or to write the dummy data into the remaining pages of the target block according to the determination result comprises:

when the determination result indicates that the amount of the data written into the target block is less than a first threshold value, or the number of the source blocks that have finished valid data moving is less than a second threshold value, discarding the target block, and performing another garbage collection operation to move the valid data of the multiple source blocks to another target block; and when the determination result indicates that the amount of the data written into the target block is not less than the first threshold value, and the number of the source blocks that have finished valid data moving is not less than the second threshold value, writing the dummy data into the remaining pages of the target block.

7. The method of claim 1, wherein the garbage collection operation is moving valid data of multiple source blocks to the target block, and the step of determining the progress of the garbage collection operation to generate the determination result comprises:

generating the determination result according to a number of source blocks within the multiple source blocks that have finished valid data moving.

8. The method of claim 7, wherein the step of determining to discard the target block in the garbage collection operation or to write the dummy data into the remaining pages of the target block according to the determination result comprises:

when the number of the source blocks that have finished valid data moving is less than a threshold value, discarding the target block, and performing another garbage collection operation to move the valid data of the multiple source blocks to another target block; and when the number of the source blocks that have finished valid data moving is not less than the threshold value, writing the dummy data into the remaining pages of the target block.

9. The method of claim 8, wherein the flash memory module is a 3D NAND-type flash memory module, the multiple source blocks are Single-Level Cell (SLC) blocks, the target block is a Triple-Level Cell (TLC) block, and the threshold value is 2, 3 or 4.

10. A flash memory controller, wherein the flash memory controller is utilized for accessing a flash memory module, and the flash memory controller comprises:

a read only memory, arranged for storing a program code; and a microprocessor, arranged for executing the program code to control access to the flash memory module;

wherein when the flash memory controller and the flash memory module are powered on, and a garbage collection operation is not finished before the flash memory module is powered on, the microprocessor determines a progress of the garbage collection operation to generate a determination result, and determines to discard a target block in the garbage collection operation or to write dummy data into remaining pages of the target block according to the determination result.

11. The flash memory controller of claim 10, wherein the garbage collection operation is moving valid data of multiple source blocks to the target block, and when the determination result indicates that the progress of the garbage collection operation is lower, the microprocessor discards the target block, and performs another garbage collection operation to move the valid data of the multiple source blocks to another target block; and when the determination result indicates that the progress of the garbage collection operation is higher, the microprocessor writes the dummy data into the remaining pages of the target block.

12. The flash memory controller of claim 10, wherein the garbage collection operation is moving valid data of multiple source blocks to the target block, and the microprocessor generates the determination result according to an amount of data written into the target block.

13. The flash memory controller of claim 12, wherein when the determination result indicates that the amount of the data written into the target block is less than a threshold value, the microprocessor discards the target block, and performs another garbage collection operation to move the valid data of the multiple source blocks to another target block; and when the determination result indicates that the amount of the data written into the target block is not less than the threshold value, the microprocessor writes the dummy data into the remaining pages of the target block.

14. The flash memory controller of claim 12, wherein the microprocessor generates the determination result according to the amount of the data written into the target block and a number of source blocks within the multiple source blocks that have finished valid data moving.

15. The flash memory controller of claim 14, wherein when the determination result indicates that the amount of the data written into the target block is less than a first threshold value, or the number of the source blocks that have finished valid data moving is less than a second threshold value, the microprocessor discards the target block, and performs another garbage collection operation to move the valid data of the multiple source blocks to another target block; and when the determination result indicates that the amount of the data written into the target block is not less than the first threshold value, and the number of the source blocks that have finished valid data moving is not less than the second threshold value, the microprocessor writes the dummy data into the remaining pages of the target block.

16. The flash memory controller of claim 10, wherein the garbage collection operation is moving valid data of multiple source blocks to the target block, and the microprocessor generates the determination result according to a number of source blocks within the multiple source blocks that have finished valid data moving.

17. The flash memory controller of claim 16, wherein when the number of the source blocks that have finished valid data moving is less than a threshold value, the microprocessor discards the target block, and performs another garbage collection operation to move the valid data of the multiple source blocks to another target block; and when the number of the source blocks that have finished valid data moving is not less than the threshold value, the microprocessor writes the dummy data into the remaining pages of the target block.

18. The flash memory controller of claim 17, wherein the flash memory module is a 3D NAND-type flash memory module, the multiple source blocks are Single-Level Cell (SLC) blocks, the target block is a Triple-Level Cell (TLC) block, and the threshold value is 2, 3 or 4.

19. An electronic device, comprising:
a flash memory module; and
a flash memory controller, arranged for accessing the flash memory module;
wherein when the flash memory module is powered on, and a garbage collection operation is not finished before the flash memory module is powered on, the flash memory controller determines a progress of the garbage collection operation to generate a determination result, and determines to discard a target block in the garbage collection operation or to write dummy data into remaining pages of the target block according to the determination result.

20. The electronic device of claim 19, wherein the garbage collection operation is moving valid data of multiple source blocks to the target block, and when the determination result indicates that the progress of the garbage collection operation is lower, the flash memory controller discards the target block, and performs another garbage collection operation to move the valid data of the multiple source blocks to another target block; and when the determination result indicates that the progress of the garbage collection operation is higher, writing the dummy data into the remaining pages of the target block.

* * * * *